(12) United States Patent
Malik

(10) Patent No.: US 6,221,774 B1
(45) Date of Patent: Apr. 24, 2001

(54) METHOD FOR SURFACE TREATMENT OF SUBSTRATES

(75) Inventor: Igor J. Malik, Palo Alto, CA (US)

(73) Assignee: Silicon Genesis Corporation, Campbell, CA (US)

( * ) Notice: Subject to any disclaimer, the term of this patent is extended or adjusted under 35 U.S.C. 154(b) by 0 days.

(21) Appl. No.: 09/286,259

(22) Filed: Apr. 5, 1999

Related U.S. Application Data

(60) Provisional application No. 60/081,408, filed on Apr. 10, 1998.

(51) Int. Cl.$^7$ .................................................. H01L 21/20
(52) U.S. Cl. .......................... 438/690; 438/691; 438/692; 216/89; 216/92
(58) Field of Search .................... 438/690, 691, 438/692; 216/89, 92

(56) References Cited

U.S. PATENT DOCUMENTS 5,374,564 * 12/1994 Bruel ....................................... 437/24
5,868,610 * 2/1999 Nishio ................................... 451/288
5,967,881 * 10/1999 Tucker ................................... 451/41
6,013,563 * 1/2000 Henley et al. ....................... 438/458

* cited by examiner

Primary Examiner—Robert Kunemund
(74) Attorney, Agent, or Firm—Townsend and Townsend and Crew LLP

(57) ABSTRACT

A polishing pad (24) is rotated about an axis parallel to a surface (10) of a semiconductor wafer (12). The polishing pad (24) is supported by a roller (22) that receives fluid (38) and distributes the fluid through the polishing pad (24) across the surface of the wafer. The surface (10) of the wafer is moved in relation to the polishing pad so that the wafer surface is smoothed, or touch-polished, with or without the use of abrasive slurry. In one embodiment the wafer is rotated between an upper roller assembly (20) and a lower roller assembly (14). In another embodiment, the polishing pad is held at an angle to the surface of the wafer to remove a ridge of material from a donor wafer for re-use in a thin film transfer process.

33 Claims, 8 Drawing Sheets

METHOD FOR SURFACE TREATMENT OF SUBSTRATES

CLAIM OF PRIORITY

This patent application claims priority under 35 U.S.C. §119(e) from the U.S. provisional patent application entitled SURFACE TREATMENT PROCESS AND SYSTEM by Igor Malik, filed Apr. 10, 1998 and assigned provisional application Ser. No. 60/081,408, the disclosure of which is hereby incorporated for all purposes.

This patent application is related to concurrently filed and commonly assigned patent applications entitled APPARATUS FOR SURFACE TREATMENT OF SUBSTRATES by Igor Malik, U.S. application Ser. No. 09/286,532 and COMPUTER MEMORY PRODUCT FOR SUBSTRATE SURFACE TREATMENT APPLICATIONS by Igor Malik, U.S. application Ser. No. 09/286,269, the disclosures of which are hereby incorporated for all purposes.

BACKGROUND OF THE INVENTION

The present invention relates to surface treatment of semiconductor substrates, and more particularly to a polishing process and system for preparing a surface of a substrate for electronic device fabrication.

One of the steps in a typical integrated circuit (IC) fabrication sequence is the preparation of the surface of the substrate for subsequent processing. The starting material for IC fabrication is often a "bulk" silicon wafer that is cut from a single-crystal silicon ingot with an abrasive saw. The wafer is typically lapped to remove saw marks and mechanical damage from the surface of the wafer, and then highly polished in several steps.

Polishing processes typically use a polishing compound, or slurry, and a polishing pad. The type of polishing process used often depends on the degree of surface finish that is desired. As the complexity of ICs increases, and the feature size, also known as the critical dimension, decreases, the preparation of the surface of the substrate becomes increasingly important.

Surface defects or contamination can cause device failure. As devices get smaller, a smaller defect may produce such a failure. Additionally, as ICs become more complex, the size of each IC die on the wafer becomes larger. A larger die has a greater probability of including a surface defect, and hence device failure, within the boundary of the die. Thus it is important to produce a substrate surface that is reasonably free of defects or contamination that might cause a device failure to achieve acceptable manufacturing yields.

Additional problems concerning surface finish arise from the new methods and techniques used in semiconductor wafer fabrication. Chemical-mechanical planarization (CMP) is an example of a technique that has gained wider application in IC fabrication as multi-layer metallization has increased. CMP processes may be performed on a variety of materials, including silicon oxide or other glass-like materials, polysilicon layers, or metal layers.

Many IC fabrication processes create ridges or holes on the surface of the wafer. Frequently, a conformal layer, such as chemical-vapor-deposition (CVD) silicon oxide, is deposited that often partially preserves the topography of these ridges and holes. In a typical CMP process, a mildly abrasive slurry is rubbed against the surface of a process wafer with a polishing pad to smooth the deposited layer into a flat surface. The slurry may have chemical components that help remove the material of the deposited layer in conjunction with the mechanical action of the slurry. Unfortunately, abrasive particles in the CMP process can contaminate the surface of the wafer if the particles are not removed.

A variety of methods and apparatus have been developed to remove particles from the surface of a wafer after a CMP process, such as brush scrubbers. One type of brush scrubber uses a special porous sponge-brush made of polyvinyl alcohol (PVA) as the brushing element. The PVA material is soft and scrubs particles from the surface of the wafer without removing or damaging the surface material.

While CMP is used to planarize fairly lumpy surfaces, other surfaces are relatively planar, but may be improved by smoothing. Such a surface is formed during a thin film transfer process. In a thin film transfer process, a thin film of material is separated from a donor, or source, substrate and attaches, or bonds, the thin film to a backing substrate, also known as a target substrate or "handle". Some thin film transfer applications attach a thin film of one material, such as single-crystal silicon, to a backing substrate of another material, such as silicon oxide, while other applications attach a thin film to a backing substrate of the same material. A variety of methods have been developed to separate a thin film from the donor substrate, but once the thin film has been attached to the backing substrate it is generally desirable to finish the surface of the thin film that was separated from the donor in preparation for device fabrication, and often to re-finish the surface of the donor wafer, as well, to prepare it for another thin film transfer.

While the methods developed for polishing single-crystal bulk wafers may be used in some instances to prepare the surface of transferred thin films and donor wafers, such methods may not be the most desirable. One disadvantage of using a wafer-polisher-type system is that such systems are relatively expensive, and also have a relatively large "footprint" that consumes a lot of floor space. Such systems also typically require mounting the wafer or wafers to a platen, often using a wax, which is time consuming and labor intensive. Such systems also generate a large quantity of particulates, and must be well isolated from the clean rooms where other steps in the fabrication process are performed. While CMP systems have been developed that do not attach the wafers to a platen with melted wax, wafers are typically attached to a platen with a transfer film.

Yet another disadvantage of using a wafer-polisher-type system to prepare the surface of a transferred thin film is the amount of material such a system might remove. Some thin film transfer processes result in a very thin film, perhaps 15 microns thick or less, being bonded to the backing wafer. Wafer-polishers also create a risk of scratching the surface of a wafer with a piece of agglomerated slurry or other particle. While some bulk wafers may be salvaged by removing additional material in order to polish through the scratch, this option might not be available when preparing the surface of a transferred thin film.

Therefore, an alternative wafer surfacing technique that eliminates or reduces the problems and issues enumerated above for conventional wafer surfacing methods is desirable.

SUMMARY OF THE INVENTION

The present invention provides a method and apparatus for finishing a surface of a semiconductor wafer. In one embodiment, an essentially cylindrical polishing pad is attached to a roller that rotates about an axis essentially parallel to a surface of a wafer. The relatively smooth surface of the wafer allows for smoothing, or touch-polishing, of the wafer with or without the use of an abrasive slurry. The initial surface smoothness of the wafer may arise from a thin-film transfer process, an epitaxial process, a pre-polishing process, or the like. The polishing pad can be permeable to allow water or other fluid to aid in the surface finishing process and remove by-products of the process. In one embodiment the polishing pad is perforated to improve the fluid flow, as the permeability of the polishing pad is generally less than that of a PVA sponge brush, which may have been designed for use with the roller. The substrate may be moved relative to the roller by rotating the substrate beneath the roller, by moving the wafer in a linear fashion beneath the roller, or in other ways or combinations of relative motion. A pressure suitable for the surface roughness, desired surface finish, pad material, and wafer material is applied between the polishing pad and the surface of the wafer. Differential surface finishing is achieved by tilting the roller with respect to the plane of the wafer, for example, to process the edge region of the wafer differentially from the center of the wafer surface.

These and other embodiments of the present invention, as well as some of its advantages and features are described in more detail in conjunction with the text below and attached figures.

DESCRIPTION OF THE PREFERRED EMBODIMENT

Figure 1A:
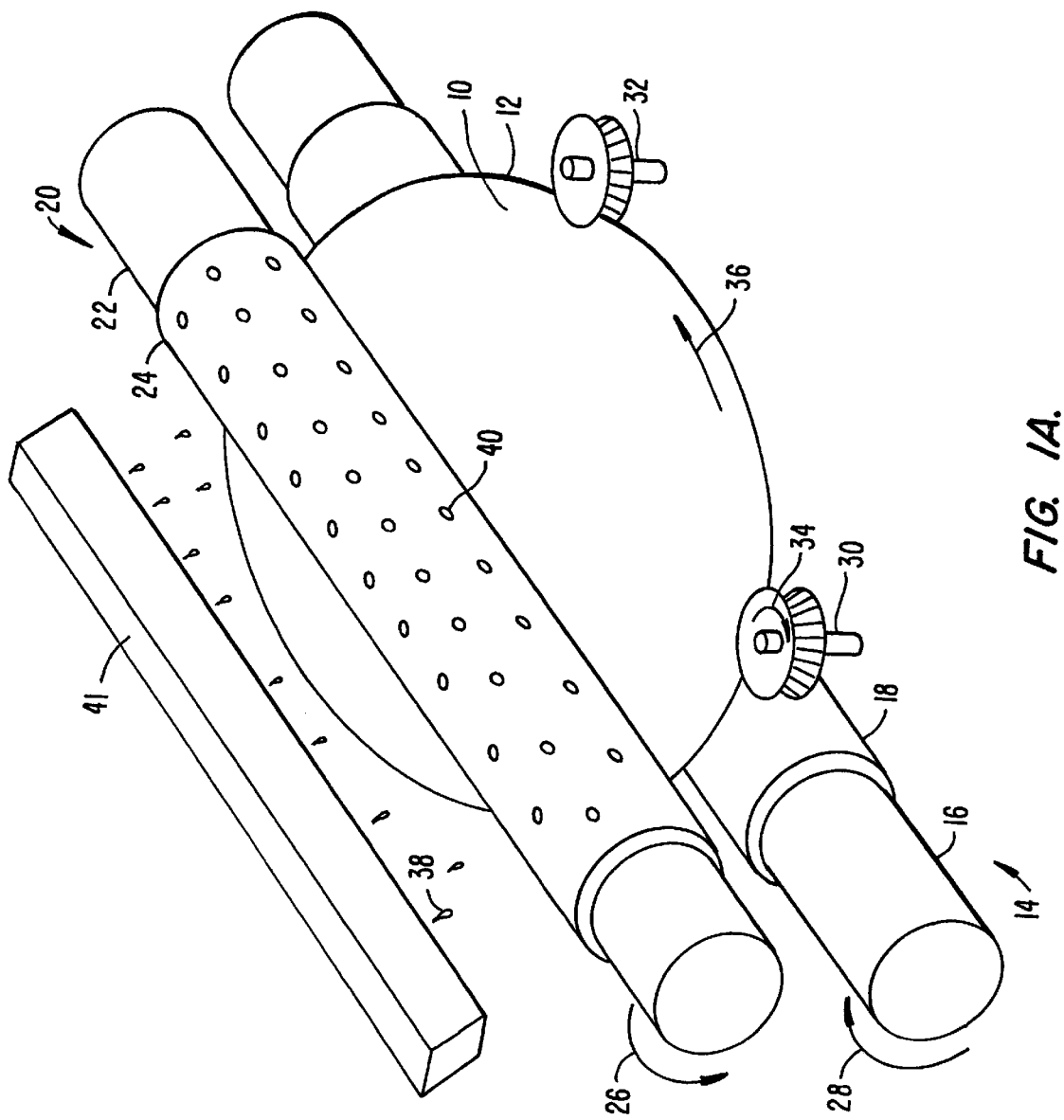
FIG. 1A is a simplified representation of a portion of a wafer surface finishing system according to one embodiment of the present invention.

The present invention provides a method and apparatus for finishing a surface of a semiconductor substrate. In a specific embodiment, the surface of a semiconductor-on-insulator (SOI) substrate that was prepared using a thin-film transfer process is smoothed using a modified brush scrubber. The modified brush scrubber finishes the surface of the substrate by using a novel pad arrangement instead of a PVA brush. The pad removes surface irregularities on a surface of a semiconductor substrate to reduce the surface roughness. The pad material can operate with or without abrasive slurry to remove a relatively small amount of semiconductor material. The invention is applicable to substrates with a relatively smooth initial surface, examples of which include pre-polished substrates with an initial surface roughness of less than about 500 Å RMS, blister-separated thin films with an initial surface roughness of about 100–150 Å RMS, cleaved substrates with an initial surface roughness of about 40–50 Å RMS, epitaxial substrates with an initial surface roughness of about 1–3 Å, and separation by ion implantation of oxygen ("SIMOX") substrates, with an initial surface roughness of about 6–10 Å RMS.

Although epitaxial substrates have an apparently smooth surface as-measured with conventional AFM techniques, it has been discovered that epitaxial substrates can develop a surface undulation or waviness that is not typically detected with conventional AFM techniques. These surface undulations interfere with the fine geometry and critical dimensions of integrated circuits, particularly during photolithography processes. Touch polishing provides a way to improve the surface quality of epitaxial wafers by reducing the amplitude of surface undulations without removing excessive epitaxial material. The ability to control the touch polishing process to remove only a minor amount of material is highly desirable because epitaxial layers, similar to thin film layers, are relatively thin.

1. Separated Surface Morphology

Various techniques have been developed to separate a thin film of material from a donor substrate for bonding to a target substrate. One technique implants gas-forming ions into the surface of a donor wafer, and then thermally treats the wafer to form a layer of microbubbles below the surface of the donor wafer to form blisters that shatter across the layer to separate a thin film of material from the donor wafer. Such a method is described in U.S. Pat. No. 5,374,564 by Michel Bruel, issued Dec. 20, 1994.

Another method is known as the room-temperature controlled cleave process ("rTCCP", a trademark of SILICON GENESIS CORPORATION of Campbell, Calif.), which is described in the commonly assigned U.S. application Ser. No. 09/026,034 by Henley and Cheung, filed Feb. 19, 1998, and which is incorporated herein for all purposes. In the rTCCP process, ions or other particles are implanted into a wafer to form a cleave layer within the donor substrate. Energy is then applied to the donor substrate to initiate and propagate a cleave front or fronts that separates a thin film of material from the donor. Typically, a target wafer is bonded to the donor wafer between the ion implantation step and the cleave step so that the thin film is attached to the target wafer after cleaving.

The cleaved surface is relatively smooth and undamaged compared to an as-sawn wafer surface. Such a smooth, undamaged surface is advantageous because a thin film may not allow much material removal before wearing through to the backing substrate. Even if a relatively thick film could be separated from a donor wafer to allow substantial material removal for surface finishing, the implantation energy required to produce such a thick film might degrade the crystalline quality of the thin film layer.

The surface roughness of a cleaved surface of a thin film of silicon on an SOI substrate was measured with an atomic force microscope (AFM) to have a root-mean-squared (RMS) value of about 50 Å measured across an area that was about 2 microns by 2 microns. The desired roughness for the intended application of the SOI substrate is an RMS value of 1 Å. It is estimated that a surface with an RMS smoothness of 1 Å could be produced by removing less than 100 Å of material from the as-cleaved surface with an initial RMS roughness of 50 Å. Thus, it may be possible to achieve the desired surface finish by removing less than twice the starting surface roughness from the substrate, although in some situations a factor of 2–4 times the starting surface roughness may have to be removed.

In a thin film transfer process, the target, or handle, wafer is typically larger than the donated thin film. A step forms where the edge of the donated thin film contacts the handle wafer. This step may become a source of contamination, or otherwise complicate subsequent processing. Touch polishing can smooth the transition from the handle wafer to the donated thin film.

In addition to finishing the surface of the transferred thin film, it is also possible to prepare the cleaved surface of the donor wafer so that the donor wafer may be reclaimed for another cleaving process. In particular, the film that is separated from the donor wafer may not extend to the edge of the donor wafer. In that instance, a ridge of donor material will persist around the rim of the donor wafer. The touch polishing apparatus may be configured so that the polishing roller is off-axis to the wafer. That is, the axis of rotation of the roller is not parallel to the surface of the wafer. The polishing rollers then can contact the edge region of the donor wafer to remove the peripheral ridge. A touch polish process, or other polishing process, can then be used to finish the surface of the donor wafer. For example, after an off-axis polishing step for edge re-conditioning, the wafer could be transported to a subsequent surface polishing station. Alternatively, after edge re-conditioning, the roller or rollers at a single touch polishing station can be re-aligned to polish the surface of the wafer. Therefore, touch polishing is a desirable technique for reclamation of a donor wafer, as the donor wafer has a cleaved surface similar to the transferred thin film, and may possibly be used several times.

2. A Surface Finishing Machine

FIG. 1A is a simplified drawing of a portion of a double-brush scrubber ("DBS") also known as a double-side scrubber ("DSS"), such as the model DSS-200™ sold by ONTRAK SYSTEMS, INC., of San Jose, Calif., that has been modified to finish the surface 10 of a semiconductor substrate 12. In this instance, the semiconductor substrate 12 is a 200 mm SOI wafer manufactured using a silicon thin-film transfer process, although the substrate could be of another material, or made by another process. A lower roller assembly 14 includes a lower drum 16 and a lower brush 18. The lower brush 18 is a PVA brush supplied with the double-brush scrubber, but could be other material. As discussed above, a feature of PVA brushes is that they dislodge particulate contamination without removing substrate material.

An upper roller assembly 20 includes an upper drum 22 and an upper pad 24. The upper pad is made from a polyurethane poromeric material a millimeter or so thick, such as pad material sold under the trade names POLITEX DG, POLITEX SUPREME, AND UR-100 by RODEL, INC., of Newark, Del., commonly referred to as "POLITEX" pads. Those skilled in the art will appreciate that other materials may be used.

The upper pad 24 rotates around the axis of the upper drum 22 as shown by the arrow 26. The lower brush 18 rotates around the axis of the lower drum 16 as shown by the second arrow 28. Drive wheels, or rollers, 30, 32 rotate in the direction shown the third arrow 34 to rotate the wafer 12 between the upper pad 24 and the lower brush 18, as shown by the fourth arrow 36. Alternatively, the wafer could be supported on a chuck that rotates with respect to the pad. It is understood that the directions of rotation may be changed in alternative embodiments, and that the wafer could be moved in a linear fashion relative to the rollers instead of, or in addition to, being rotated between the rollers.

De-ionized (DI) water 38 or other process fluid, such as slurry or a chemical agent, enters through the interior of the upper roller assembly 20 and the lower roller assembly 14 to help the smoothing process and to carry away particulate matter that might be generated. To improve the flow, the upper pad is optionally perforated with holes 40, the total area of the perforations being about 5% of the total area of the upper pad 24. The number, size, and area percentage of the perforations may be adjusted according to the particular process, depending on the type of material being smoothed, the initial surface roughness, the type of pad material, and the transconductance of water through the particular pad being used, among other factors.

In some applications, it is not necessary to deliver water or other processing fluid through the upper drum and pad. In those instances, the pad need not be porous or perforated. One type of pad that could be used in such an embodiment is a pad with abrasive particles embedded in a matrix, similar to a type of cleaning pad commonly known as a SCOTCHBRITE™ pad, sold by the 3M Company. Such pads may be used with or without slurry, and may be configured to receive water from a manifold or sprayer.

A manifold 41 above the upper pad 24 can drip or spray solutions onto the upper pad 24 or wafer 12, if desired. Such solutions may aid in the removal of material from the surface of the wafer by chemical or mechanical action. It is understood that chemicals or other processing solutions may also be added to the DI water line as an alternative or in addition to the solutions supplied by the manifold.

The upper pad has sufficient tribological properties to smooth the cleaved surface to the required surface finish without the use of abrasive slurry; however, slurry may be used in some applications. Surprisingly, smoothing occurs without slurry even though the surface material is harder than the pad material.

A slurry-free process is desirable for many reasons. Such a process reduces the chances that the wafer surface will be scratched or otherwise damaged by slurry agglomerates, and can remove a relatively minor amount of material. A slurry-free process also simplifies the waste stream management of the process, as needing to dispose of used slurry, especially if contaminated with environmentally undesirable compounds from the polishing process, may be difficult and expensive. It is understood that slurry may be used in some embodiments of the above process, if desired.

The use of a modified double-brush scrubber for wafer surface finishing has several other advantages over the use of conventional wafer polishing machines. One advantage is the reduced cost of the machine, which can be less than about one fourth the cost of a conventional CMP or wafer polishing machine. Another advantage is that a double-brush scrubber modified for a slurry-free process requires fewer facility hook ups, as a slurry mixer, slurry pump, and slurry drain are not required as they typically would be with conventional wafer polishers. Yet another advantage of the modified double-brush scrubber is its comparatively small footprint compared to conventional wafer polishers, which saves floor space in the fabrication area that is often very expensive.

Figure 1B:
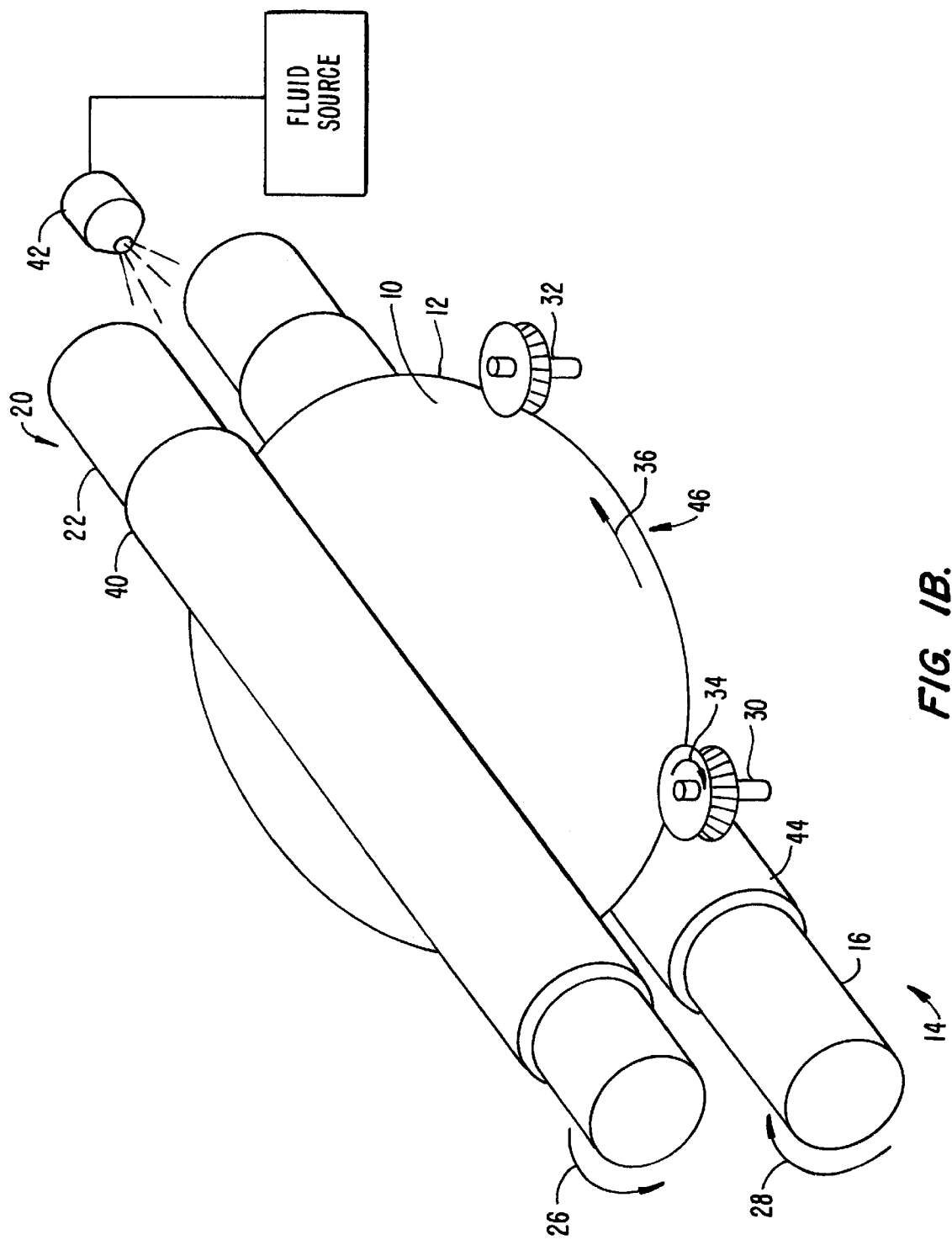
FIG. 1B is a simplified representation of a portion of a wafer surface finishing system with a lower pad, according to another embodiment of the present invention.

FIG. 1B is a simplified view of a modified double brush scrubber with an upper pad 40 that is not perforated. A sprayer 42 applies process fluid, such as DI water or slurry, to the surface 10 and/or pad. A lower pad 44 supports the wafer 12 so that the upper pad 40 may provide a pressure of between about 2–10 psi to the wafer. The lower pad may also be a polishing pad, and may operate to smooth the lower surface 46 of the wafer 12. The linear contact area is less than the total surface area of the wafer. Therefore, given a wafer mounting force, a higher pressure may be applied along the linear contact area than could otherwise be applied against the entire surface of the wafer in a typical pad polishing technique. This allows alternative, simpler wafer mounting techniques to be used with linear contact polishing methods, and also allows higher pressures to be applied along the linear contact area, as the total force applied to the wafer remains relatively small. The higher pressures, in turn, allow greater latitude in the polishing process, such as using a particular type of smoothing pad without a slurry, while providing efficient polishing, thus reducing process time.

Figure 1C:
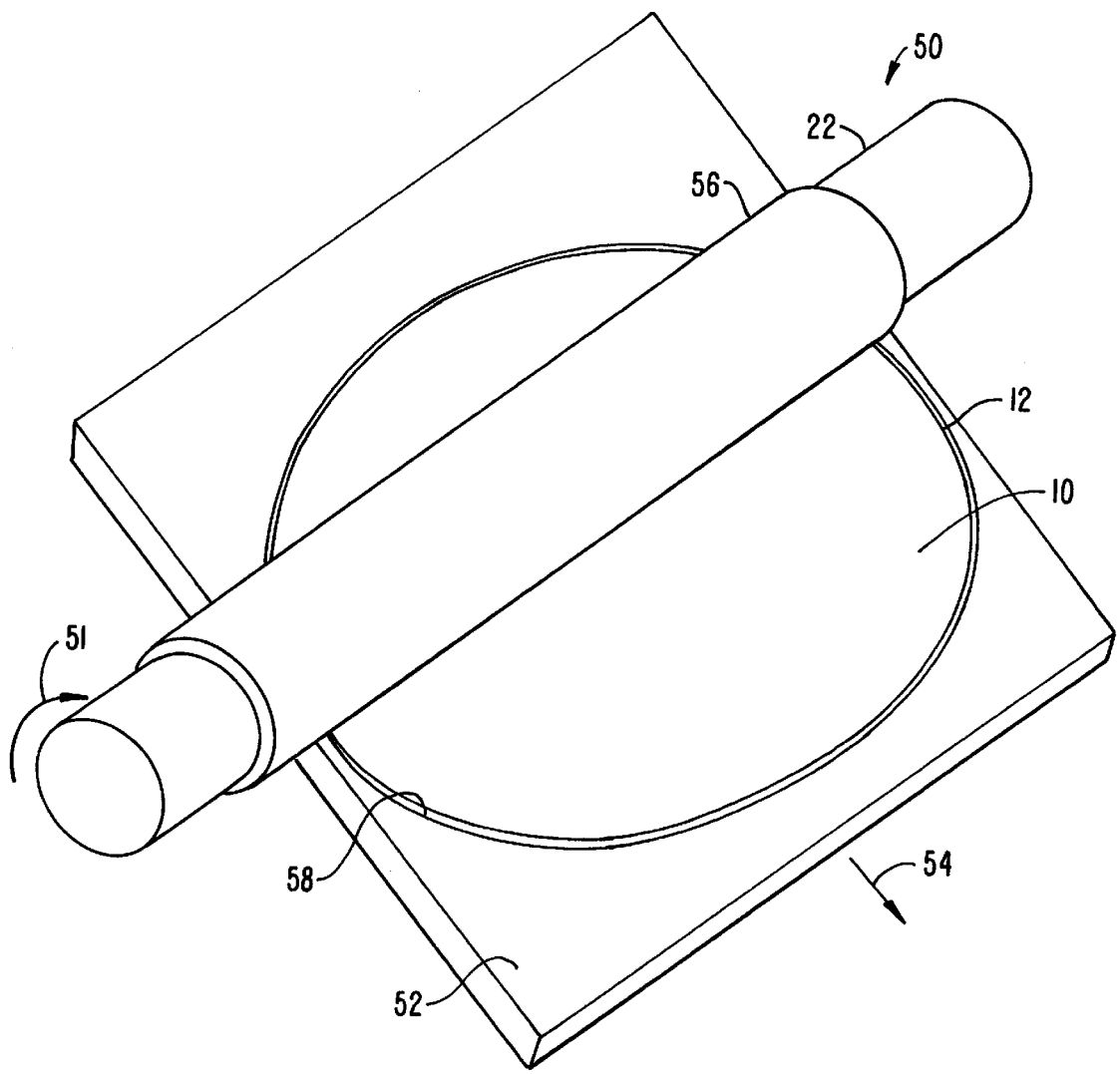
FIG. 1C is a simplified representation of a portion of a wafer surface finishing system with a wafer carrier, according to another embodiment of the present invention.

FIG. 1C is a simplified view of a touch polisher with a single roller assembly 50 and a wafer carrier 52 that transports the wafer 12 in the direction shown by the arrow 54. The roller 50 rotates in a clock-wise direction as shown by the arrow 51, but could rotate in a counter clock-wise direction. In this embodiment the wafer does not rotate with respect to the pad 56, and the wafer carrier 52 provides support for the wafer 12 so that substantial pressure, at least 10 psi, may be applied by the pad to the surface of the wafer. The wafer 12 sits in a wafer pocket 58, and may be held in place with a vacuum chuck, an electrostatic chuck, or other means. Drive wheels are not needed to rotate the wafer; however, if rotation is desired, a rotating chuck could be provided, or the rollers could rotate on an axis perpendicular to the surface of the wafer, holding the wafer and chuck fixed. Such embodiments are particularly suitable for situations when a high pressure is used between the wafer surface 10 and the polishing pad 56, as higher pressures generally require greater drive wheel force if the wafer were rotated between the upper and lower rollers, as shown in FIGS. 1A and 1B. Slurry or other liquid may be applied from a drip manifold (not shown) or sprayer (not shown) as described above in conjunction with FIGS. 1A and 1B.

Figure 1D:
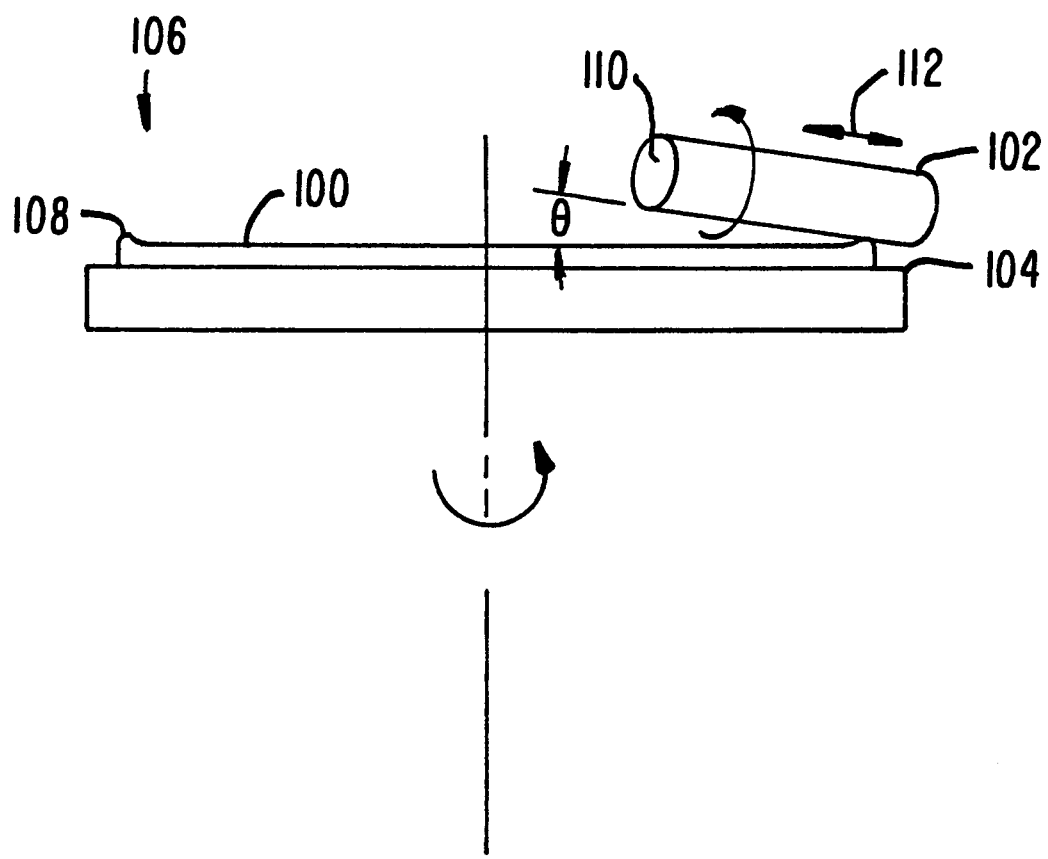
FIG. 1D is a simplified side view of a portion of an off-axis surface finishing system.

FIG. 1D is a simplified side view of a wafer 100 and an off-axis polishing pad 102. The polishing pad is tilted at a selected angle 0, generally between about 1–15 degrees, from the wafer support surface 104. In a preferred embodiment, the polishing pad is tilted about 5 degrees from the wafer support surface. Tilting the pad with respect to the wafer allows the pad to finish the edge region 106 of the wafer surface. The wafer could be a thin film donor wafer, for example, with a perimeter ridge 108 that is an artifact of the thin film transfer process. The polishing pad 102 is mounted on a polishing roller 110 that rotates about an axis of the roller. The wafer moves relative to the axis of the roller, in this instance by rotating beneath the roller about an axis essentially normal to the wafer support surface. It is possible to use a roller with a length less than the radius of the wafer, and the polishing pad may oscillate along the axis of rotation, as represented by the double arrow 112. A cylindrical roller and polishing pad are not necessary to finish the edge of a wafer, and other pad configurations, such as a planar pad, could be utilized. It is further understood that the wafer and/or wafer chuck or other support structure could be tilted with respect to the polishing pad and roller.

Figure 2:
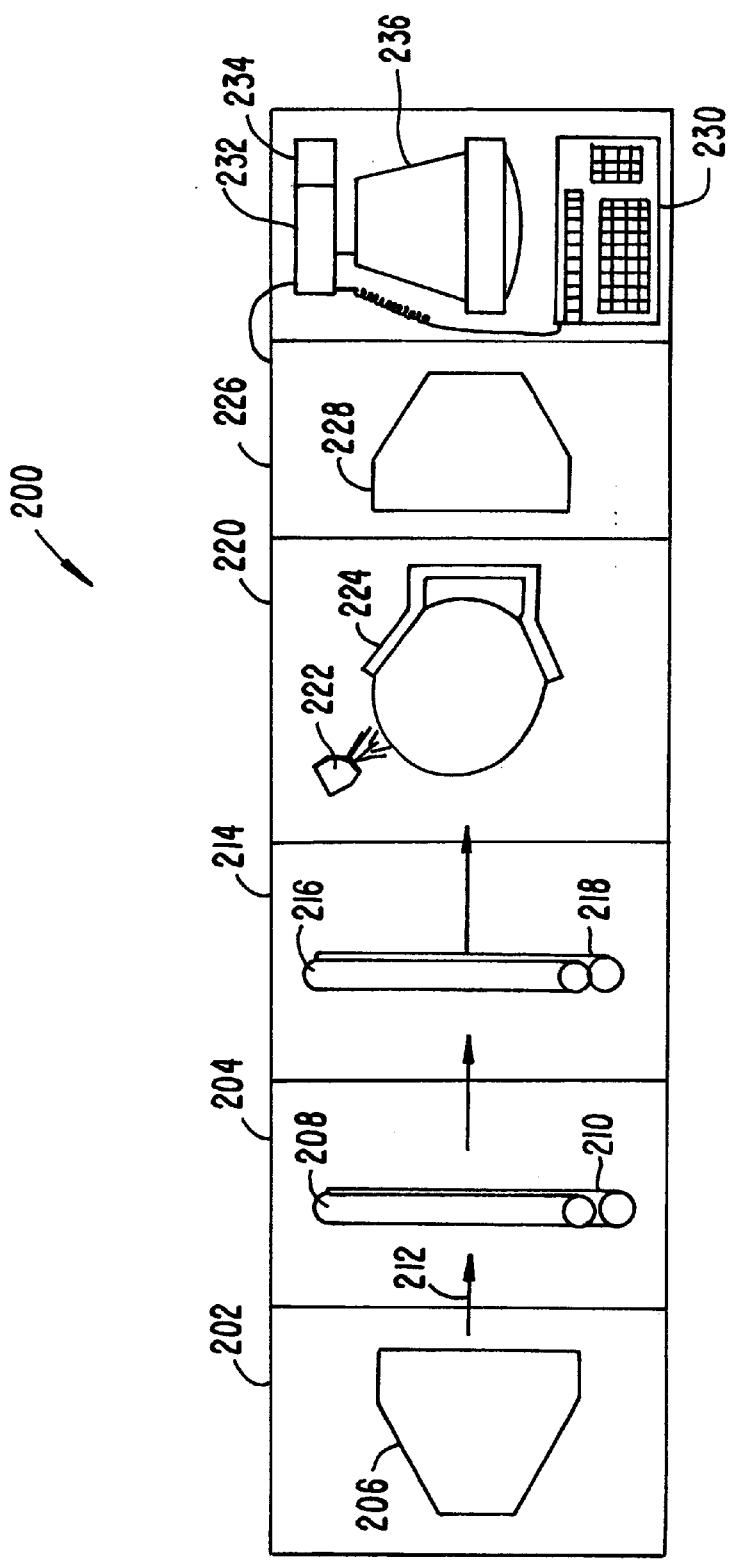
FIG. 2 is a simplified top view of a wafer surface finishing system according to one embodiment of the present invention.

FIG. 2 is a simplified top view of a wafer finishing system 200. A wafer is loaded at the load station 202 and automatically conveyed to the first brush station 204. The wafer may be automatically loaded from a cassette 206 that holds several wafers. One of the rollers 208 in the first brush station 204 is covered with a polishing pad, as described above, while the other roller 210 is covered with a PVA brush. The wafer is automatically conveyed between the brushes in the direction shown by an arrow 212 as the rollers are spinning to finish a surface of the wafer. It is understood that the polishing pad may be applied to the lower roller rather than the upper roller, that the roller opposite the polishing roller may be covered with material other than PVA, and that the rotational axis of the roller and surface of the wafer may be in a vertical or other orientation, rather than a horizontal orientation. Force is applied to the wafer through the first and second rollers to maintain adequate pressure between the polishing pad and the wafer surface to finish the surface of the wafer.

The appropriate force is selected according to a number of variables, including the durometer of the polishing pad, the tribological properties of the polishing pad, the initial surface roughness of the substrate, the desired final surface finish of the substrate, the substrate material, the fluid flow, and the type of fluid used in the smoothing process. The force may be adjusted in a variety of fashions, including providing an external spring force, an external gravitational force, an inherent gravitational force of the roller and fluid, or by fixing a distance between the first roller and second roller such that the elasticity and durometer of the upper and lower pads or brush provide the desired pressure on the surface of the wafer when it is inserted between the rollers. In one instance, the distance between rollers is fixed to polish a cleaved silicon surface having an initial surface roughness of about 40 Å using a POLITEX SUPREME™ pad and a PVA sponge brush at an estimated pressure of about 5 psi, although pressures between about 2–10 psi might be used. Modifications to brush scrubbers are often required, as sponge brushes are generally designed to have very low contact pressures with the wafer, but several double brush scrubbers allow the distance between rollers to be set, and this parameter may be used to adjust the pressure.

After finishing the surface at the first brush station 204, the wafer is automatically conveyed to the second brush station 214 where PVA brushes on both the upper 216 and lower 218 rollers clean particulates from the wafer. While two brush stations are typically needed to remove particulate contamination after a conventional slurry-type polishing operation, a single brush station sufficiently cleans the wafer after the touch-polishing operation of the first station. It is believed a single stage of double-brush cleaning is adequate because of the lack of slurry, because of the lesser amount of material that is removed, or a combination of these and other factors. In other applications, the surface finishing may be done using slurry, and additional cleaning methods, including additional brush scrubbing operations, may be performed.

After the brush cleaning at the second brush station 214, the wafer is automatically conveyed to a spin module 220, where a final DI water rinse 222 is performed and the wafer is spun-dried. In some applications, the spin-dry may be performed with a solvent, such as isopropyl alcohol. A wafer handler 224 automatically removes the wafer from the spin dryer and transfers the wafer to the unloading station 226. Wafers may be loaded and unloaded one at a time, or a cassette 228 holding several wafers may be adapted to load and unload a batch of wafers.

In instances where slurry is used, the slurry is contained within the brush box. If this does not provide adequate protection against particulate contamination of the process area, the wafer input and output stations may be accessible from the clean room, with the touch-polish and brush box located outside of the clean room. If additional cleaning is necessary after the touch polishing operation, an additional DBS box or boxes may be added, or additional cleaning may be performed off-line at a wet bench or other cleaning tool.

The wafer finishing system 200 is controlled by a user through a user interface 230, such as a keyboard or touch screen, that inputs data into an electronic computer 232, which includes a memory 236. Status of the system, selected parameters, and other information is displayed to the user on a display 234. A control sequence for controlling the operation of the finishing system and operating program is entered or loaded into the memory 236. The memory can include read-only memory, magnetic media such as disks or tapes, optical media, such as CDROM, flash ROM, or the like. Loading an operating program into the memory 236 of the computer 232 configures the system 200 for wafer finishing. It is understood that a wafer finishing system could also be controlled manually, or automatically without computer control.

3. An Exemplary Surface Finishing Process

Figure 3A:
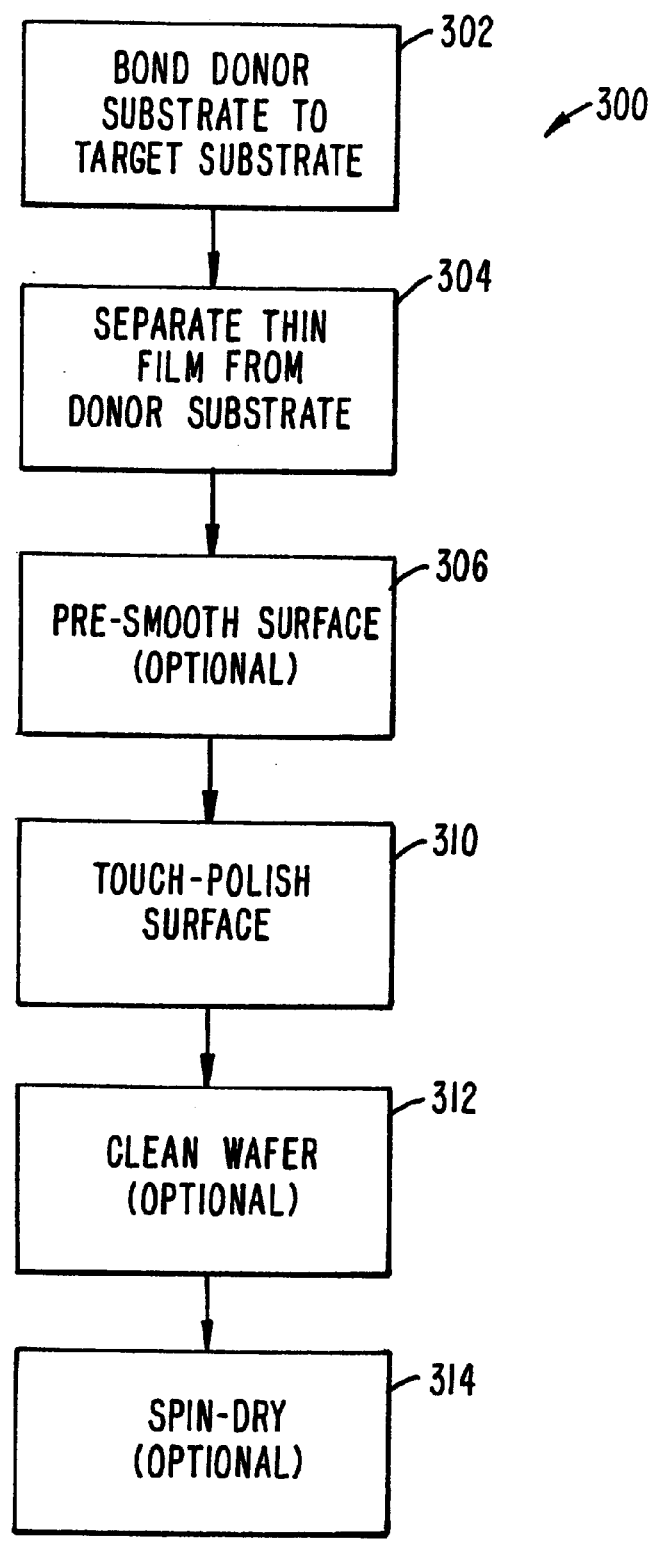
FIG. 3A is a simplified flow chart of a touch-polishing process for a cleaved surface according to one embodiment of the present invention.

FIG. 3A is a simplified flow chart of an exemplary surface finishing process 300 according to the present invention. A composite substrate is formed by bonding a donor substrate to a target substrate (step 302) and separating a thin film of donor material from the donor substrate (step 304). An optional pre-smoothing step may be performed (step 306). For example, a steam thermal oxidation followed by a hydrofluoric acid dip may reduce surface roughness because of the increased chemical activity of silicon atoms, and hence increased propensity to form oxide, at the peaks and corners of the silicon surface, or an anneal in hydrogen may be performed, or a soak in hydrogen chloride vapor, or additional material may be applied with an epitaxial growth process to pre-smooth the surface of the substrate. Annealing the wafer in hydrogen offers the advantage over some other pre-smoothing methods in that essentially no material is removed or added to the surface of the substrate by the pre-smoothing process. Pre-smoothing the surface of the substrate can result in a surface that is an order of magnitude smoother. For example, a surface with an initial roughness of about 50 Å RMS can be pre-smoothed to a surface roughness of about 5 Å RMS. Silicon in these types of regions preferentially oxidizes and the oxide is subsequently removed, resulting in a surface with reduced roughness. Similar methods can be used after touch-polishing as "post-smoothing", to enhance the surface finish.

The composite substrate is smoothed, or "touch polished", by differential motion of a roughly cylindrical polishing pad against the surface of the wafer with or without the use of abrasive slurry (step 310). The polishing pad is held against the cleaved surface of the substrate with a pressure of about 3 psi. This causes the polishing pad to deform slightly, resulting in a linear contact area. The wafer is optionally rotated, as shown and discussed in FIG. 1, at a speed of between about 5–10 rpm. The pad, which, in one embodiment, is about two inches in diameter, is rotated at a speed of about 100 rpm, as is the brush, although other size pads and other speeds can be used, and the pad and brush need not be rotated at the same speed. After polishing, the wafer is cleaned (step 312) in a double-sided scrubber process to remove particulates, and then spun (step 314) as a final drying step. In some applications, the brush scrubbing step may be unnecessary, and other cleaning methods or drying methods may be used. If slurry were applied during the surface finishing step, a cleaning step would probably be performed.

Figure 3B:
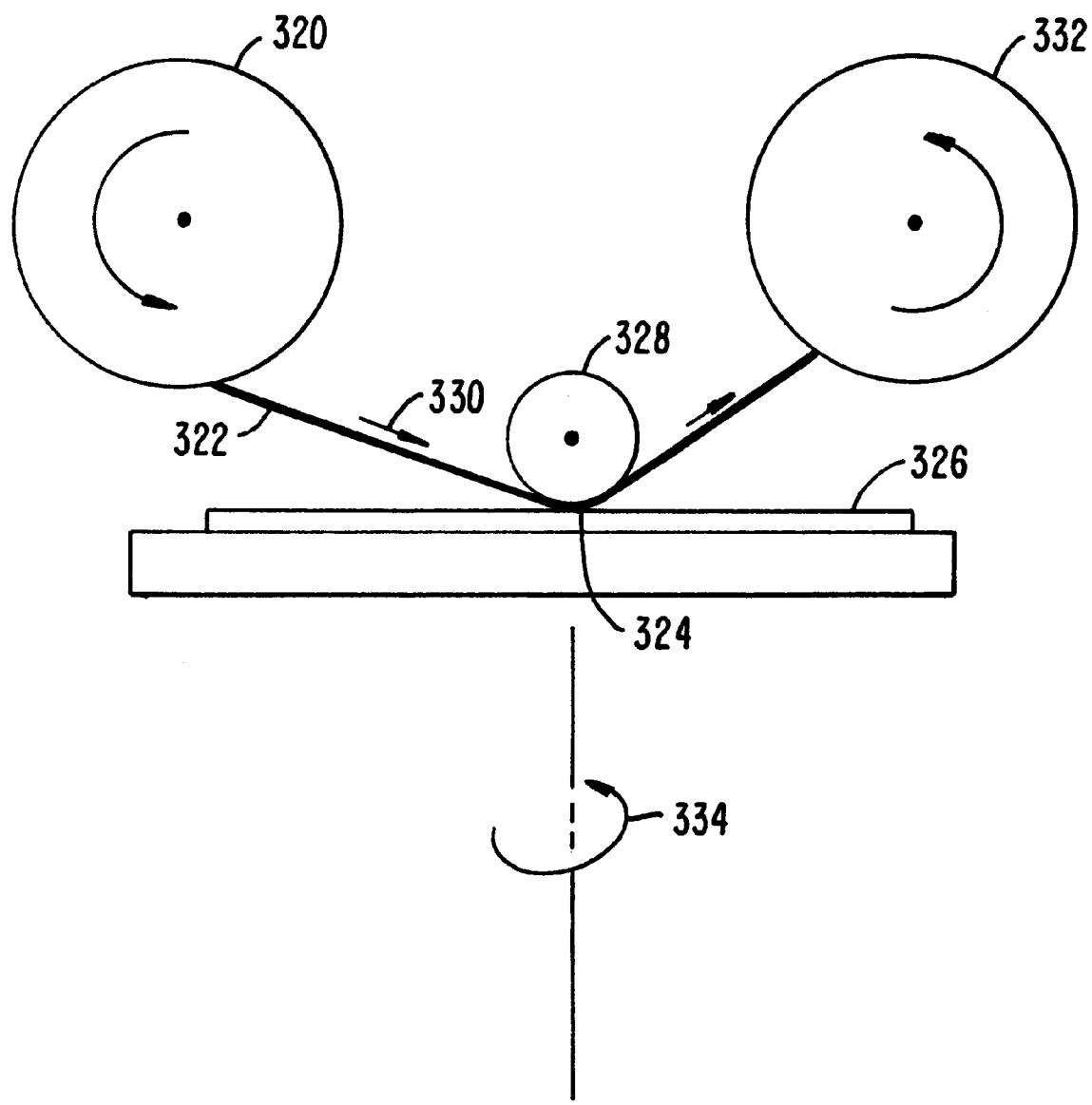
FIG. 3B is a simplified side view of a portion of a substrate finishing system with a source spool of pad material and take-up roller.

FIG. 3B is a simplified cross section of an alternative polishing pad used in a touch polish system. A source spool 320 contains a length of polishing pad material 322 in the form of a sheet or ribbon wrapped around the source spool. The source spool provides polishing pad material to the polishing interface 324 between the substrate 326 and a polishing bar 328 at a selected rate, the rate represented by the arrow 330. The polishing bar can be a roller, including a roller made from a compliant material such as rubber or a hard material such as stainless steel, or may be bar that does not rotate, but has a sufficiently low coefficient of friction to allow movement of the polishing pad past the roller.

Used polishing pad material is accumulated on a take-up spool 332. Alternatively, the used polishing pad material may be conveyed to a waste bin. The polishing pad may be polyurethane material, as above, or a woven or fused cloth carrying applied or impregnated with abrasive compounds and/or a chemical aid to polishing, or similar material. Thus, each wafer in a series of wafers being touch polished is exposed to pad material having about the same "age" (polishing time). This provides a more consistent process and greater processing time (number of wafers polished) between changing pads, which in this case would be a spool of pad material. In an off-axis system, the pad does not need to be as wide as the wafer, or even the radius of the wafer, but rather may be relatively thin, as contact might be made only in a particular area of the substrate, such as in the edge region. Similarly, the pad may be relatively thin and oscillate across the surface of the wafer to polish the entire surface. In an oscillating system polishing parameters, such as polishing force, may be selectively varied according to the radius of the material being polished. For example, if the wafer is rotating and a relatively thin polishing pad is oscillating from the essentially the perimeter of the wafer to the center, then the applied pressure may vary from a lesser value near the perimeter to a greater value near the center, to account for the difference in angular velocity at the contact region in order to achieve a more uniform polishing process.

Figure 4:
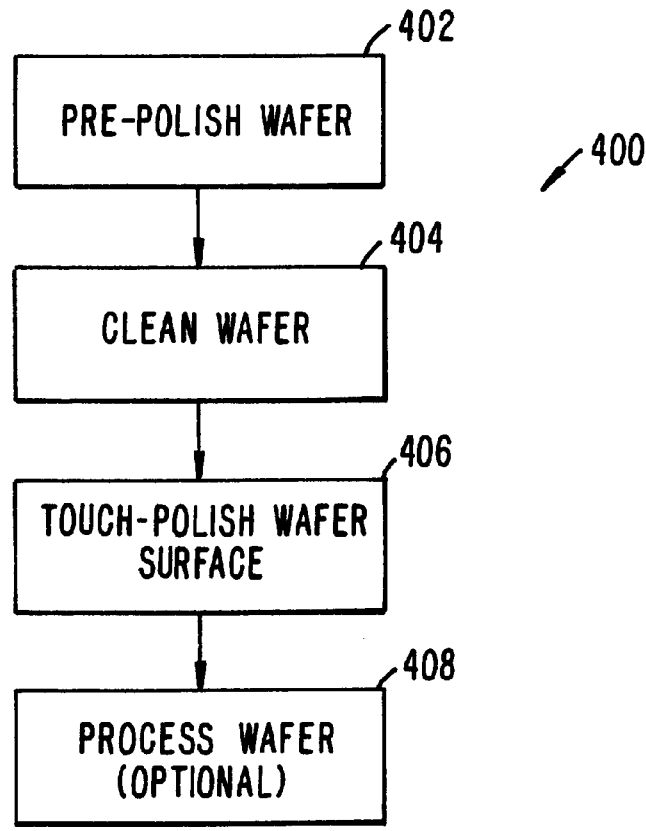
FIG. 4 is a simplified flow chart of a touch polishing process for a pre-polished bulk wafer according to another embodiment of the present invention.

FIG. 4 is a simplified flow diagram of another embodiment of a surface finishing process 400 according to another embodiment of the present invention. A wafer is pre-polished (step 402) and optionally cleaned (step 404) by conventional methods. Whether or not a wafer is cleaned depends on several factors, such as the compatibility of the pre-polishing slurry, if any, with the touch polishing process, the effectiveness of any subsequent cleaning processes that may be performed, and so forth. The wafer could be a bulk silicon wafer, for example, after sawing from an ingot that is pre-polished to remove saw damage and to produce a surface suitable for smoothing. The wafer is then smoothed (step 406) to produce the final surface finish, after which optional additional wafer processing (step 408), such as brush scrubbing, dipping, oxidizing, stripping, or wafer fabrication may occur.

Figure 5:
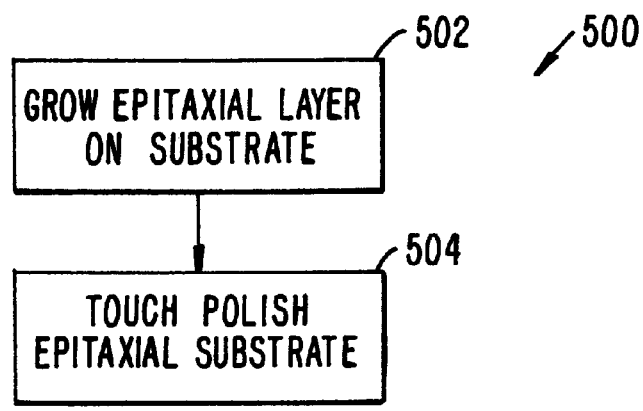
FIG. 5 is a simplified flow chart of a touch polishing process for an epitaxial wafer.

FIG. 5 is a simplified flow chart of a touch polishing process applied to an epitaxial wafer. Epitaxial wafers often have a relatively smooth surface, about 1–3 Å RMS by AFM measurement, but an epitaxial surface can have undulations. Touch smoothing reduces the amplitude of the undulations without removing too much of the thin epitaxial layer. An epitaxial layer is grown on a homogeneous or heterogeneous substrate (step 502). The epitaxial process does not generate the type of particles that a pre-polish process or other processes might, so a cleaning step is not usually required between the epitaxial growth step and the touch-polish step (step 504). However, a cleaning process or other process, such as an oxidation and strip process, may be performed prior to touch polishing.

While the above is a complete description of specific embodiments of the present invention, various modifications, variations, and alternatives may be employed. For example, alternative materials and substrate configurations could be used. Specifically, a silicon-on-silicon wafer may be used instead of a silicon-on-insulator wafer, or a silicon carbide, gallium-arsenide, silicon-germanium wafers, or compliant substrates, such as hetero-epi substrates or other substrates in the family of compliant substrates, may be surface finished. Additionally, the cleaved surface of the donor wafer could be prepared for another thin-film transfer by the above methods. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. A method of finishing a surface of a semiconductor substrate comprising steps of:
   (a) bonding a donor substrate to a target substrate;
   (b) separating a thin film of donor semiconductor material from the donor substrate, the thin film of donor material adhering to the target substrate to form a composite substrate with a separated surface; and
   (c) touch-polishing the separated surface with an essentially cylindrical polishing pad, the polishing pad rotating about a first axis, the first axis being essentially parallel to the separated surface, while moving the separated surface relative to a contact polishing area of the polishing pad.

2. The method of claim 1 wherein the donor substrate comprises a semiconductor material.

3. The method of claim 2 wherein the donor substrate comprises single-crystal silicon.

4. The method of claim 1 wherein the thin film comprises polysilicon.

5. The method of claim 2 wherein the target substrate is a silicon wafer.

6. The method of claim 2 further comprising a step, after the step (b) and prior to the step (c) of pre-polishing the separated surface.

7. The method of claim 6 wherein the step of pre-polishing includes growing an oxide layer on the separated surface and stripping the oxide layer.

8. The method of claim 2 wherein the target substrate comprises silicon oxide.

9. The method of claim 1 wherein the step (c) includes rotating the composite substrate about a second axis relative to a roller, the roller holding the polishing pad in contact with the composite substrate, the second axis being essentially normal to the cleaved surface.

10. The method of claim 1 wherein the thin film is separated from the donor substrate by a controlled cleave process.

11. The method of claim 1 wherein the thin film is separated from the donor substrate by a blister separation method.

12. The method of claim 1 wherein the step (c) of touch polishing includes use of a slurry.

13. A method of finishing a cleaved surface of a donor wafer comprising steps of:
   (a) separating a thin film of material from the donor wafer to form a separated surface on the donor wafer; and
   (b) touch-polishing the separated surface with an essentially cylindrical polishing pad, the polishing pad rotating about a first axis, the first axis forming an angle between about 0–30 degrees with the separated surface, while moving the separated surface relative to a contact area of the polishing pad.

14. A method of finishing a surface of an epitaxial wafer comprising steps of:
   (a) growing an epitaxial layer on a surface of a substrate to form an epitaxial wafer with an epitaxial surface; and
   (b) touch-polishing the epitaxial surface with an essentially cylindrical polishing pad, the polishing pad rotating about a first axis, the first axis being essentially parallel to the epitaxial surface, while moving the epitaxial surface relative to a polishing contact area of the polishing pad.

15. The method of claim 14 wherein the epitaxial surface comprises silicon.

16. The method of claim 14 wherein the epitaxial surface comprises a compound semiconductor material selected from the group consisting of gallium arsenide, silicon carbide, gallium nitride, and silicon-germanium.

17. The method of claim 14 wherein the epitaxial surface is on a compliant substrate.

18. The method of claim 14 wherein the substrate is a single-crystal silicon wafer.

19. The method of claim 14 wherein the step (c) includes rotating the epitaxial wafer about a second axis, the second axis being essentially normal to the epitaxial surface.

20. A method of finishing a surface of a semiconductor substrate, the method comprising steps of:
   (a) providing a semiconductor substrate, the surface having an initial surface roughness of less than about 500 Å RMS;
   (b) pressing a polishing pad against the surface of the semiconductor substrate with a cylindrical polishing bar to form a linear contact area between the polishing pad and the surface of the semiconductor substrate; and
   (c) moving the surface of the substrate relative to the linear contact area.

21. The method of claim 20 wherein the cylindrical polishing bar comprises a roller.

22. The method of claim 20 further comprising a step of providing the polishing pad from a source roller to the linear contact area.

23. A method of finishing a surface of a semiconductor substrate, the method comprising steps of:
   (a) pre-polishing the surface of the semiconductor substrate to obtain a surface roughness of less than about 300 Å RMS; and
   (b) touch-polishing the surface of the semiconductor substrate with a polishing pad, the polishing pad being held in contact with the semiconductor substrate by a polishing roller rotating about a first axis, the first axis being essentially parallel to the surface of the semiconductor substrate, while moving the surface of the semiconductor substrate relative to a contact area of the polishing pad in contact with the semiconductor substrate.

24. The method of claim 23 wherein the semiconductor is a bulk silicon wafer.

25. A method of finishing a surface of a silicon substrate comprising steps of:
   (a) implanting insulator-forming particles through a polished surface of the silicon substrate;
   (b) pre-smoothing the silicon substrate; and
   (c) touch-polishing the surface of the silicon substrate with an essentially cylindrical polishing pad, the polishing pad rotating about a first axis, the first axis being essentially parallel to the surface of the semiconductor substrate, while moving the surface of the semiconductor substrate relative to a contact area of the polishing pad.

26. The method of claim 25 wherein the insulator-forming particles comprise nitrogen.

27. The method of claim 25 wherein the insulator-forming particles comprise oxygen.

28. The method of claim 25 further comprising post-smoothing the silicon substrate after the step (c) of touch-polishing.

29. A method of converting a double-brush scrubber to a wafer surface finishing system, the method comprising steps of:
   (a) installing a polishing pad on at least one roller of a double-brush scrubber for polishing the wafer surface with the polishing pad; and
   (b) setting the one roller in relation to an opposing roller such that, during a wafer surface finishing operation, a contact force between a contact area of the polishing pad and the wafer surface is greater than about 2 psi.

30. The method of claim 29 further comprising a step, prior to the step (a), of perforating the polishing pad to form a plurality of conduits for fluid to flow from an interior portion of the one roller through the conduits.

31. The method of claim 29 wherein the polishing pad includes a matrix containing embedded abrasive particles.

32. A method of preparing a surface of a donor wafer for re-use in a thin-film transfer process, the method comprising:
   (a) providing a donor wafer having a ridge of donor material in a perimeter region of a surface of the donor wafer;
   (b) applying a polishing pad to only the perimeter region of the surface of the donor wafer such that the polishing pad contacts at least the ridge of donor material; and
   (c) moving the donor wafer relative to the polishing pad to remove the ridge of donor material from the donor wafer.

33. A method of finishing a surface of a composite thin film wafer, the thin film transfer wafer having a thin film of material bonded to a handle wafer, the perimeter of the thin film of material forming a step with the handle wafer, the method comprising:
   (a) supporting the composite thin film wafer with a wafer support;
   (b) pressing a polishing pad against the composite thin film wafer at an angle greater than about 0 degree between the polishing pad and a surface of the composite thin film wafer to selectively engage the step; and
   (c) moving the composite thin film wafer relative to the polishing pad to smooth the step.

* * * * *